US007169374B2

(12) United States Patent
Siochi et al.

(10) Patent No.: US 7,169,374 B2
(45) Date of Patent: Jan. 30, 2007

(54) TEMPLATED GROWTH OF CARBON NANOTUBES

(75) Inventors: Emilie J. Siochi, Newport News, VA (US); Tarek Abdel-Fattah, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 11/129,751

(22) Filed: May 11, 2005

(65) Prior Publication Data

US 2006/0013756 A1 Jan. 19, 2006

Related U.S. Application Data

(60) Provisional application No. 60/570,964, filed on May 12, 2004.

(51) Int. Cl.
*C01B 31/02* (2006.01)
*D01F 9/12* (2006.01)

(52) U.S. Cl. .................... 423/447.3; 977/742; 977/842

(58) Field of Classification Search ............ 423/447.3; 977/742, 842
See application file for complete search history.

(56) References Cited

U.S. PATENT DOCUMENTS

| | | | | |
|---|---|---|---|---|
| 6,129,901 | A | 10/2000 | Moskovits et al. | |
| 6,231,744 | B1 | 5/2001 | Ying et al. | |
| 6,333,016 | B1 | 12/2001 | Resasco et al. | |
| 6,350,488 | B1 | 2/2002 | Lee et al. | |
| 6,359,288 | B1 | 3/2002 | Ying et al. | |
| 6,413,487 | B1 | 7/2002 | Resasco et al. | |
| 6,602,932 | B2 * | 8/2003 | Feldheim et al. | 523/201 |
| 2003/0148086 | A1 * | 8/2003 | Pfefferle | 428/293.7 |

OTHER PUBLICATIONS

Liz, W.Z., et al, "Large-Scale Synthesis of Aligned Carbon Nanotubes," Science, vol. 274, p. 1701, (1996).

M. Terrones, et al, "Controlled Production of Aligned-Nanotube Bundles," Nature, 388, 52, (1997).

Kresge, et al, "Ordered Mesoporous Molecular Sieves Synthesized by a Liquid-Crystal Template Mechanism," Nature, vol. 359, p. 710 (1992).

Beck, et al, "A New Family of Mesoporous Molecular Sieves Prepared With Liquid Crystal Templates," J. Am. Chem. Soc., vol. 114, p. 10834, (1992).

Suh, Jung Sang and Less, Jin Seung, "Highly Ordered Two-Dimensional Carbon Nanotube Arraysm," Applied Physics Letter, Oct. 4, 1999, 2047-2049, vol. 75, No. 14, American Institute of Physics.

Masuda, Hideki and Satoh, Massahiro, "Fabrication of Gold Nanodot Array Using Anodic Porous Alumina as an Evaporation Mask," Jpn J. Appl. Phys., Jan. 15, 1996, L126-L-129, Part 2, No. 1B.

Li, Jing, Moskovits, Martin, Haslett, Tom L., "Nanoscale Electroless Metal Deposition in Aligned Carbon Nanotubes," Chem. Mater. 1998, 10, Jul. 1,1998, 1963-1967, American Chemical Society.

Davydow, D.N., Sattari, P.A., Alma Wlawi, D., Osika, A., Haslett, T.L., and Moskovits, M., "Field Emitters Based on Porous Aluminum Oxide Templates," Journal of Applied Physics, Oct. 1, 1999, 3983-3987, vol. 86, No. 7, American Institute of Physics.

Kyotani, Takashi, Tsai, Li-Fu, and Tomita Akira, "Preparation of Ultrafine Carbon Tubes in Nanochannels of an Anodic Aluminum Oxide Films," Chem. Mater, 1996, 8, 2109-2113, American Chemical Society.

Yao, Zhen, Postma, Henk W. Ch., Balents, Leon, and Dekker, Cees, "Carbon Nanotube Intramolecular Junctions," Letters to Nature, vol. 402, Nov. 18,1999, 273-276, Macmillan Magazines Ltd.

Lee, Jin Seung, Gu, Geun Hoi, Kim, Hoseong, Jeong, Kwang Seok, Bae, Jiwon, and Suh, Jung Sang, "Growth of Carbon Nanotubes on Anodic Aluminum Oxide Templates: Fabrication of a Tube-in-Tube and Linearly Joined Tube," Chem. Mater, 2001, 2387-2391, American Chemical Society.

Che, G., Lakshmi, B.B., Martin, C.R., and Fisher, E.R., "Chemical Vapor Deposition Based Synthesis of Carbon Nanotubes and Nanofibers Using a Template Method," Chem Mater, 1998, 10, 260-267, American Chemical Society.

Ji, L., Lin, J., and Zeng, H.C., "Formation Route of Carbon Nanotubes in a Gel Matrix," Chem Mater., 2000, 12, 3466-3471, American Chemical Society.

Kresge, C.T., Leonowicz, M.E., Roth, W.J., Vartuli, J.C., and Beck, J.S., "Ordered Mesoporous Molecular Sieves Syntesized by a Liquid Crystal Template Mechanism," Letters to Nature, 710-712, vol. 359, Oct. 22, 1992.

Abdel-Fattah, Tarek H. and Pinnavaia, Thomas J., "Tin-Substituted Mesoporous Silica Molecular Sieve (Sn-HMS): Synthesis and Properties as a Heterogenous Catalyst for Lactide Ring-Opening Polymerization," Chem Commun., 1996, 665-666.

Haruyama, Junji, Takesu, Izumi, Ohta, Keisuke, and Koganei, Ryoji, "Novel Carbon Nanotube Array in Nano-Porous Alumina: Weak Localization and Coulomb Blockade," Foresight Institute Preparing for Nanotechnology, 1-3.

Martin, Charles R., "Templated Nanotubes in Chemical and Bio Separations and Analyses," Department of Chemistry, Foresight Institute Preparing for Nanotechnology, 1-2.

Ren, Z.F., Huang, Z.P., Wang, D.Z., and Wen, J.G., "Large Arrays of Well-Aligned Carbon Nanotubes," Department of Physics, 1-2.

Suh, Jung Sang, Lee, Jin Seung, and Kim Hoseong, "Linearly Joined Carbon Nanotubes," Synthetic Metals, 123, 2001, 381-383.

* cited by examiner

*Primary Examiner*—Stuart L. Hendrickson
*Assistant Examiner*—Alvin T. Raetzsch
(74) *Attorney, Agent, or Firm*—Robin W. Edwards

(57) ABSTRACT

A method of growing carbon nanotubes uses a synthesized mesoporous silica template with approximately cylindrical pores being formed therein. The surfaces of the pores are coated with a carbon nanotube precursor, and the template with the surfaces of the pores so-coated is then heated until the carbon nanotube precursor in each pore is converted to a carbon nanotube.

16 Claims, 1 Drawing Sheet

TEMPLATED GROWTH OF CARBON NANOTUBES

ORIGIN OF THE INVENTION

The invention described herein was made in part by an employee of the United States Government and may be manufactured and used by or for the Government for governmental purposes without the payment of any royalties thereon or therefor.

BACKGROUND OF THE INVENTION

1. Field of the Invention

This invention relates to the growth of carbon nanotubes. More specifically, the invention is a method of growing carbon nanotubes in a template to provide for uniformly-dimensioned carbon nanotubes.

2. Description of the Related Art

Since their discovery in 1991, carbon nanotubes (CNTs) have attracted significant attention due to their unique electronic, mechanical, and chemical properties. Their electronic and chemical properties give CNTs the potential for a wide range of novel applications to include advanced scanning probes, electron field emission sources, hydrogen storage materials, and building blocks of molecular electronics. CNTs' extraordinary mechanical properties make them ideal candidates for use as reinforcing fibers in nanocomposites.

Unfortunately, while there are many advantages to using CNTs, there are also several problems associated with their fabrication (i.e., synthesis). The main problems are that current CNT synthesis methods cannot produce large quantities of CNTs with consistent quality that is defined by substantially uniform length and diameter, since both length and diameter of CNTs affect the properties and/or behavior of the CNTs. More specifically, CNT length can affect mechanical properties of materials the CNTs are supposed to reinforce, while CNT diameters influence electrical characteristics of the CNTs. Another problem associated with current CNT synthesis methods is that the CNTs grow together in bundles and prefer to agglomerate rather than disperse in a matrix, thereby reducing their effectiveness as a mechanical reinforcement.

To overcome some of these fabrication problems, developers have tried to use templates to control CNT growth. However, the various template growth methods have been unable to achieve individual and separated CNTs of uniform length and diameter at a reasonable cost. Further, some templating materials/methods contaminate the CNTs during the growth thereof so that the ultimate CNTs are not pure.

SUMMARY OF THE INVENTION

Accordingly, it is an object of the present invention to provide a method of growing CNTs.

Another object of the present invention is to provide a templated method of growing CNTs that yields substantially uniform length and diameter CNTs.

Still another object of the present invention is to provide a templated method of growing CNTs that yields pure CNTs that are uncontaminated by the template.

A still further object of the present invention is to provide a templated method of growing CNTs that is cost effective.

Other objects and advantages of the present invention will become more obvious hereinafter in the specification and drawings.

In accordance with the present invention, a method of growing carbon nanotubes starts by synthesizing a template made from a mesoporous silica having approximately cylindrical pores formed therein. The inner surfaces of the pores are then coated with a carbon nanotube precursor capable of being carbonized upon the heating thereof. The template with the surfaces of the pores so-coated is then heated until the carbon nanotube precursor in each pore is converted to a carbon nanotube.

BRIEF DESCRIPTION OF THE DRAWINGS

Other objects, features and advantages of the present invention will become apparent upon reference to the following description of the embodiments and to the drawings, wherein corresponding reference characters indicate corresponding parts throughout the several views of the drawings and wherein.

DETAILED DESCRIPTION OF THE INVENTION

Figure 1:
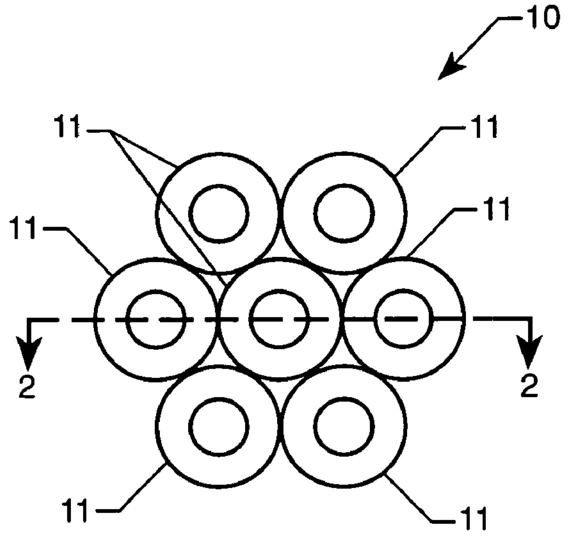
FIG. 1 is a top view of a hexagonal pack of hollow mesoporous silica cylinders that form a template of mesoporous silica used in the method of the present invention.
Figure 2:
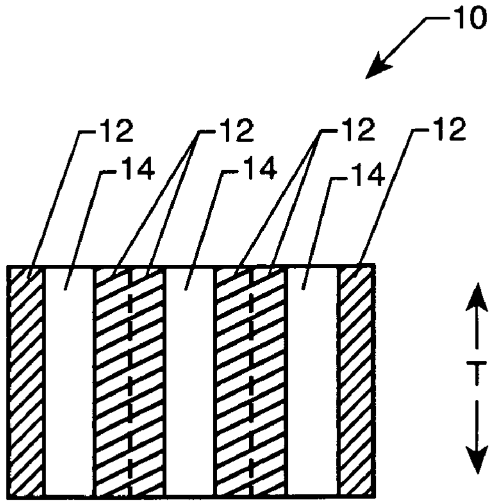
FIG. 2 is a cross-sectional view of the synthesized template of mesoporous silica taken along line 2—2 in FIG. 1.

Referring now to the drawings, and more particularly to a top view in FIG. 1 and a cross-sectional view in FIG. 2, a synthesized template for use in the present invention is shown and is referenced generally by numeral 10. Template 10 is formed by a close pack configuration of hollow mesoporous cylinders 11 arranged in a hexagonal pack. This arrangement of cylinders 11 defines a mesoporous silica 12 (FIG. 2) having approximately cylindrical pores 14 formed therein that serve as the mold for growing carbon nanotubes (CNTs) in accordance with the present invention. In this illustrated example, mesoporous silica 12 is of uniform thickness T with individual approximately cylindrical pores 14 extending all the way therethrough. Pores 14 are straight and can be parallel to one another as shown. When it is desired to produce a quantity of CNTs having substantially uniform diameters, each of approximately cylindrical pores 14 should have the same (or nearly the same) diameter. For example, a sample template was synthesized to yield approximately cylindrical pores 14 having diameters in the range of 3.5–4.0 nanometers. This diameter range provides CNTs that are useful for a variety of applications to include mechanical reinforcement, electrical conductivity enhancement, and possibly thermal management.

As is known in the art of template construction, approximately cylindrical pores 14 are formed by the following general steps: providing approximately cylindrical rods (not shown) that are typically made from an organic material and have outside diameters equal to the desired inside diameters of approximately cylindrical pores 14, synthesizing mesoporous silica about the rods whereby the rods become "plugs" within mesoporous silica cylinders 11, and then removing the "plugs" (e.g., via organic material degradation) to yield the structure illustrated in FIGS. 1 and 2. The synthesizing of mesoporous silica (about the rods/plugs that will be removed to define approximately cylindrical pores 14) is known in the art. See, for example, "Ordered Mesoporous Molecular Sieves Synthesized by a Liquid-Crystal Template Mechanism," Kresge et al., Nature 1992, Vol. 359, p. 710, and "A New Family of Mesoporous Molecular Sieves Prepared With Liquid Crystal Templates," Beck et al., J. Am. Chem. Soc., Vol. 114, 1992, p. 10834.

Briefly, reagents used for the synthesis of template 10 included ammonium hydroxide ($NH_4OH$) at 30 weight percent, tetraethylorthosilicate (TEOS), aluminum isopropoxide [$(iso\text{-}pro)_3Al$] and cityltrimethylammonium bromide (CTABr). The synthesis of mesoporous silica template 10 was performed using the following reaction composition 1.0 TEOS: 0.01 [$(iso\text{-}pro)_3Al$]: 0.2 CATBr: 0.5 $NH_4OH$: 150 $H_2O$. The resulting gel was aged for 3 days at 110° C. in TEFLON™-lined stainless steel autoclaves. The product was filtered, washed with distilled water, dried in air, and finally calcined at 650° C. for 6 hours. The 650° C. exposure step removes the organic "plugs" by degradation. The resulting aluminum mesoporous silica can then be, but is not required to be, treated with 0.1M solution of cobalt nitrate ($Co(NO_3)_2$) solution, iron salts, nickel salts, or any other metal salts for 4 hours to impregnate cobalt in the mesoporous silica. The product is then filtered, washed with distilled water, and dried.

Figure 3:
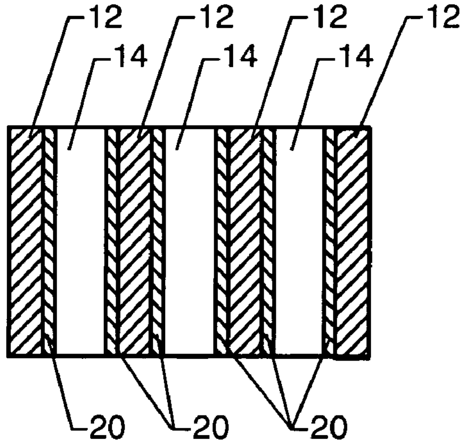
FIG. 3 is a cross-sectional view of the synthesized template with the approximately cylindrical pores thereof coated with a carbon nanotube precursor in accordance with the method of the present invention.

The next step in the present invention is to coat the surfaces of each of approximately cylindrical pores 14 with a carbon nanotube precursor 20 as shown in FIG. 3. While carbon nanotube precursor 20 is essentially any hydrocarbon that can be carbonized through the heating thereof to form a CNT (e.g., polymers, solvents such as toluene, or other aromatic hydrocarbons), one of the great advantages of the present invention is achieved when carbon nanotube precursor 20 is sugar-based. For example, carbon nanotube precursor 20 can be based on the readily-available and inexpensive table sugar or sucrose. Since carbon nanotube precursor 20 is most effective when its hydrocarbon content is optimized and since sucrose has many hydroxyl (—OH) groups, it is advantageous to reduce the number of hydroxyl groups present in sucrose prior to the carbonization thereof to form CNTs. One way of reducing sucrose's hydroxyl groups while simultaneously coating the surface of approximately cylindrical pores 14 will now be explained by way of example.

Sucrose is first mixed in solution with sulfuric acid with the resulting mixture then being impregnated into template 10. Such impregnation can be achieved in a variety of ways to include, but not limited to, immersion of template 10 into the sucrose/sulfuric acid solution, flowing the sucrose/sulfuric acid solution over/through template 10, or otherwise introducing the sucrose/sulfuric acid solution into approximately cylindrical pores 14 of template 10. The sulfuric acid removes some water from the sucrose to thereby reduce the hydroxyl group content of the sucrose to effectively convert same to an intermediate (sucrose-based) carbon black that serves as carbon nanotube precursor 20. After such impregnation with the sucrose/sulfuric acid solution, template 10 so-impregnated is dried (e.g., at 160° C. in a nitrogen atmosphere) to yield the structure illustrated in FIG. 3.

Figure 4:
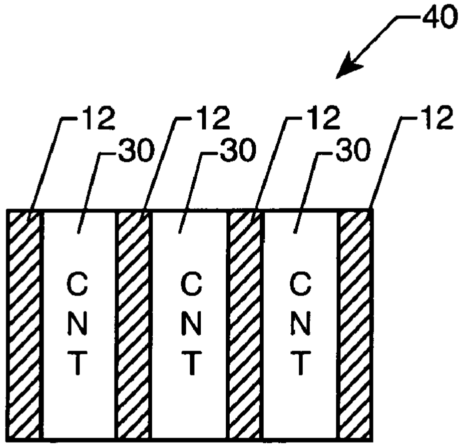
FIG. 4 is a part cross-sectional, part schematic view of the synthesized template having CNTs formed in the approximately cylindrical pores after carbonization of the carbon nanotube precursor in accordance with the method of the present invention.

To grow CNTs, the structure illustrated in FIG. 3 is heated to bring about the carbonization of carbon nanotube precursor 20. That is, a CNT 30 (FIG. 4) grows from carbon nanotube precursor 20 coated on approximately cylindrical pores 14. For the illustrated example of a reduced hydroxyl group derivative of sucrose serving as carbon nanotube precursor 20, heating temperatures in the range of 700–900° C. were used to successfully grow CNTs 30. Time for such heating ranged from 8–12 hours. Such heating can be performed while applying a vacuum, or inert atmosphere such as nitrogen, helium, or argon to the structure illustrated in FIG. 3 in order to reduce the temperature at which CNT growth is completed. It was found that the increased hydrocarbon content of a reduced hydroxyl group derivative of sugar served to optimize the inventive method by providing the chemical structure more favorable to yielding the high hydrocarbon content of the target product, i.e., CNTs 30. Since CNTs 30 grow from carbon nanotube precursor 20 which is constrained within approximately cylindrical pores 14, CNT growth and the resulting CNTs 30 are defined by approximately cylindrical pores 14 that, in this example, are straight and have substantially uniform diameters and lengths.

Following the growth of CNTs 30 in approximately cylindrical pores 14, the resulting structure is a monolithic carbon-silica nanocomposite 40 that can function as a semiconducting material. The shape and size of semiconducting nanocomposite 40 can be tailored during the formation of the mesoporous silica template.

If it is desired to utilize CNTs 30 by themselves, mesoporous silica 12 can be removed to thereby yield a plurality of uniform length and diameter CNTs 30. To retain the straight and parallel nature of CNTs 30 in mesoporous silica 12 after silica 12 is removed, it may be necessary to couple one or both ends of each of CNTs 30 to a support (not shown) prior to the removal of mesoporous silica 12. Removal of mesoporous silica 12 can be achieved by dissolving silica 12 through application of a solvent (e.g., hydrofluoric acid) that does not react with CNTs 30.

The advantages of the present invention are numerous. By constraining CNT growth to pre-sized tubes, CNTs having uniform length and diameter can be grown easily and simply. The process yields individual and straight CNTs that will not be bundled or aggregated. Further, the ability to use readily-available, inexpensive and non-hazardous sugars as the source for the carbon nanotube precursor will greatly improve the affordability of CNTs.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A method of growing carbon nanotubes, comprising the steps of:

synthesizing a template made from a mesoporous silica such that said template has a plurality of approximately cylindrical pores formed therein;

coating surfaces of each of said approximately cylindrical pores with a carbon nanotube precursor capable of being carbonized upon the heating thereof; and heating said template with said surfaces of said approximately cylindrical pores so-coated until said carbon nanotube precursor in each of said approximately cylindrical pores is converted to a carbon nanotube, wherein said carbon nanotube precursor is sugar-based.

2. A method of growing carbon nanotubes, comprising the steps of:

synthesizing a template made from a mesoporous silica such that said template has a plurality of approximately cylindrical pores formed therein;

coating surfaces of each of said approximately cylindrical pores with a carbon nanotube precursor capable of being carbonized upon the heating thereof; and heating said template with said surfaces of said approximately cylindrical pores so-coated until said carbon nanotube precursor in each of said approximately cylindrical pores is converted to a carbon nanotube;

wherein, said step of coating includes the step of impregnating said template with a solution of sucrose diluted in a liquid.

3. A method of growing carbon nanotubes, comprising the steps of:

synthesizing a template made from a mesoporous silica such that said template has a plurality of approximately cylindrical pores formed therein;

coating surfaces of each of said approximately cylindrical pores with a carbon nanotube precursor capable of being carbonized upon the heating thereof; and heating said template with said surfaces of said approximately cylindrical pores so-coated until said carbon nanotube precursor in each of said approximately cylindrical pores is converted a carbon nanotube;

wherein said step of coating includes the step of impregnating said template with a solution of sucrose diluted in sulfuric acid.

4. A method for growing carbon nanotubes, comprising the steps of:

synthesizing a template made from a mesoporous silica such that said template has a plurality of straight approximately cylindrical pores formed therein in a parallel relationship to one another with each of said straight approximately cylindrical pores having an inside diameter in the range of approximately 3.5–4.0 nanometers;

coating surfaces of each of said straight approximately cylindrical pores with sugar-based carbon nanotube precursor; and healing said template with said surfaces of said straight approximately cylindrical pores so-coated until said sugar-based carbon nanotube precursor in each of said straight approximately cylindrical pores is converted to a carbon nanotube.

5. A method according to claim 4 wherein said step of synthesizing includes the step of impregnating mesoporous silica with a material selected from the group consisting of cobalt, iron, nickel and any other active metal.

6. A method according to claim 4 wherein said step of coating comprises the step of impregnating said template with a solution of a sugar diluted in a liquid select to reduce a length of time associated with said step of heating.

7. A method according to claim 6 wherein said sugar is sucrose an said liquid is sulfuric acid.

8. A method according to claim 4 further comprising, during said step of heating, the step selected from the group consisting of applying a vacuum to said template and applying an inert atmosphere to said template.

9. A method according to claim 4 further comprising the steps of dissolving said template after said step of heating.

10. A method for growing carbon nanotubes, comprising the steps of:

synthesizing a template made from mesoporous silica such that said template has a plurality of approximately cylindrical pores formed 74 therein;

impregnating said template with a solution of sucrose diluted in sulfuric acid;

drying said template so-treated wherein surfaces of each of said approximately cylindrical pores are coated with a reduced hydroxyl group derivative of sucrose; and heating said template with said surfaces of said approximately cylindrical pores so-coated until said reduced hydroxyl group derivative of sucrose in each of said approximately cylindrical pores is converted to a carbon nanotube.

11. A method according to claim 10 wherein said step of synthesizing includes the step of impregnating mesoporous silica with a material selected from the group consist of cobalt, iron, nickel and any other active metal.

12. A method according to claim 10 further comprising, during said step of heating, the step selected from the group consisting of applying a vacuum to said template and applying an inert atmosphere to said template.

13. A method according to claim 10 further comprising the step of dissolving said template after said step of heating.

14. A method according to claim 10 wherein said step of heating is carried out at a temperature in the range of 700–900° C.

15. The method according to claim 4 further comprising, during said step of heating, the step selected from the group consisting of applying a vacuum to said template and applying an inert atmosphere to said template, wherein the inert atmosphere is selected from the group consisting of nitrogen, helium and argon.

16. The method according to claim 10 further comprising, during said step of heating, the step selected from the group consisting of applying a vacuum to said template and applying an inert atmosphere to said template, wherein the inert atmosphere is selected from the group consisting of nitrogen, helium and argon.

* * * * *